(12) United States Patent
Yang et al.

(10) Patent No.: US 7,196,766 B2
(45) Date of Patent: Mar. 27, 2007

(54) DEFECT CORRECTION OF PIXEL ELECTRODE BY CONNECTION TO GATE LINE

(75) Inventors: Yong-Ho Yang, Seoul (KR); Joo-Sun Yoon, Seoul (KR); Kyo-Seop Choo, Suwon-si (KR); Jin-Suk Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/778,693

(22) Filed: Feb. 13, 2004

(65) Prior Publication Data

US 2004/0201803 A1   Oct. 14, 2004

(30) Foreign Application Priority Data

Apr. 8, 2003   (KR) .................... 10-2003-0021875

(51) Int. Cl.
*G02F 1/13* (2006.01)

(52) U.S. Cl. ........................ 349/192; 349/54; 349/55

(58) Field of Classification Search ............. 349/114, 349/54–55, 192
See application file for complete search history.

(56) References Cited

U.S. PATENT DOCUMENTS

| | | | |
|---|---|---|---|
| 6,671,015 B2* | 12/2003 | Tanada et al. | 349/113 |
| 6,753,934 B2* | 6/2004 | Park et al. | 349/39 |
| 6,778,233 B2* | 8/2004 | Matsuura et al. | 349/54 |
| 6,781,658 B1* | 8/2004 | Choi | 349/139 |
| 6,885,420 B2* | 4/2005 | Kim et al. | 349/43 |
| 6,888,597 B2* | 5/2005 | Ha et al. | 349/114 |
| 6,980,264 B2* | 12/2005 | Lee et al. | 349/54 |
| 2002/0063824 A1* | 5/2002 | Ha et al. | 349/113 |
| 2003/0122987 A1* | 7/2003 | Kim et al. | 349/43 |
| 2004/0233346 A1* | 11/2004 | Cheng | 349/54 |
| 2004/0246395 A1* | 12/2004 | Chang | 349/55 |

* cited by examiner

*Primary Examiner*—Andrew Schechter
*Assistant Examiner*—Phu Vu
(74) *Attorney, Agent, or Firm*—F. Chau & Associates, LLC

(57) ABSTRACT

In an array substrate and an LCD apparatus having the same, the array substrate includes a signal line, a first insulating layer formed on the signal line, and a pixel electrode formed on the first insulating layer and overlapped with the signal line. The pixel electrode is electrically connected with the signal line so as to discharge a signal through the signal line. A second insulating layer is disposed between the pixel electrode and the first insulating layer, and includes an opening formed in an overlapped area of the pixel electrode and the signal line so as to partially expose the first insulating layer. Thus, the LCD apparatus may have an enhanced display quality.

22 Claims, 9 Drawing Sheets

DEFECT CORRECTION OF PIXEL ELECTRODE BY CONNECTION TO GATE LINE

CROSS-REFERENCE TO RELATED APPLICATION

This application relies for priority upon Korean Patent Application No. 2003-21875 filed on Apr. 8, 2003, the contents of which are herein incorporated by reference in its entirety.

BACKGROUND OF THE INVENTION

1. Field of the Invention

The present invention relates to an array substrate and a liquid crystal display (LCD) apparatus having the same, and more particularly to an array substrate capable of improving a display quality and an LCD apparatus having the same.

2. Description of the Related Art

In general, an LCD apparatus includes an array substrate, a color filter substrate and a liquid crystal layer interposed between the array substrate and the color filter substrate.

The array substrate includes a transmissive electrode electrically connected to a thin film transistor (referred as TFT), and a reflective electrode disposed on the transmissive electrode such that the transmissive electrode is partially exposed.

The color filter substrate includes a color filter, a planarization layer and a common electrode successively formed thereon. The color filter includes red (R), green (G) and blue (B) color pixels so as to display a predetermined color while a light passes therethrough.

In order to maximize reflection efficiency, the color filter includes the R, G and B color pixels partially overlapped with each other without forming a separate black matrix between the R, G and B color pixels. The color filter, generally, has the planarization layer disposed thereon so as to reduce step-difference caused between the R, G and B color pixels of the color filter. The common electrode is uniformly formed in terms of a thickness on the planarization layer.

However, a protrusion, for example, such as a fine dust caused by a process environment or a protrusion generated by an aggregation of the planarization layer itself, may be formed on the planarization layer. The protrusion has a size of about 1.0 μm to about 10 μm.

The protrusion formed on the planarization layer may electrically shorts between the common electrode of the color filter substrate and the pixel electrode of the array substrate. That is, since the common electrode is uniformly formed as in a thickness on the planarization layer, the common electrode is protruded by a height as high as the protrusion formed on the planarization layer. As a result, the common electrode and the pixel electrode may be electrically shorted to each other. Consequently, a high pixel that is a pixel of the short occurrence shows relatively whiter in color on a screen of the LCD apparatus. Particularly, as a cell gap is decreased, a number of protrusions caused by a non-uniform of the planarization layer may be increased, thereby increasing the high pixel.

BRIEF SUMMARY OF THE INVENTION

The present invention provides an array substrate capable of enhancing a display quality.

The present invention provides an LCD apparatus having the above array substrate.

In one aspect of the invention, an array substrate includes a signal line, a first insulating layer disposed on the signal line, a pixel electrode disposed on the first insulating layer and a second insulating layer interposed between the first insulating layer and the pixel electrode.

The pixel electrode is formed on the first insulating layer to be overlapped with the signal line, and electrically connected to the signal line so as to discharge a signal externally provided through the signal line. The second insulating layer includes an opening formed in the overlapped area of the pixel electrode and the signal line so as to expose the first insulating layer.

In another aspect of the invention, an LCD apparatus includes a first substrate, a second substrate on which the common electrode is disposed facing the first substrate, and a liquid crystal layer interposed between the first and second substrates.

The first substrate includes a signal line, a first insulating layer disposed on the signal line, a pixel electrode formed on the first substrate, overlapped with the signal line and electrically connected with the signal line so as to discharge a signal externally provided through the signal line, and a second insulating layer disposed between the pixel electrode and the first insulating layer, and having an opening formed in the overlapped area of the pixel electrode and the signal line so as to expose the first insulating layer.

According to the array substrate and the LCD apparatus having the same, the gate line disposed on the array substrate is overlapped with the pixel electrode disposed under the inorganic insulating layer, and electrically connected with the pixel electrode so as to discharge a signal applied to the pixel electrode. The organic insulating layer includes an opening through which the inorganic insulating layer. Thus, the LCD apparatus may improve a display quality thereof.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
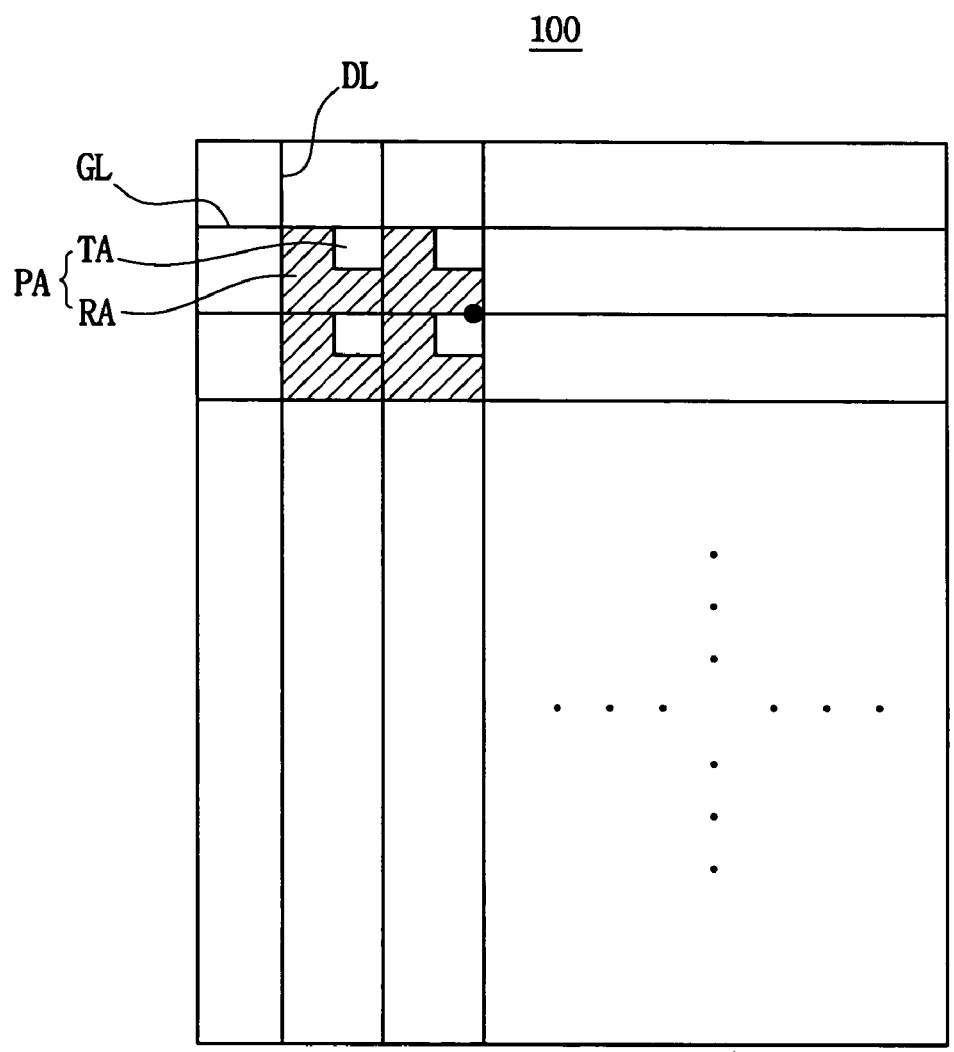
FIG. 1 is a schematic plan view showing an array substrate according to an exemplary embodiment of the present invention.
Figure 1:
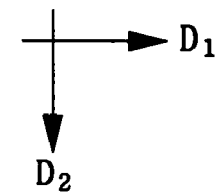
Figure 2:
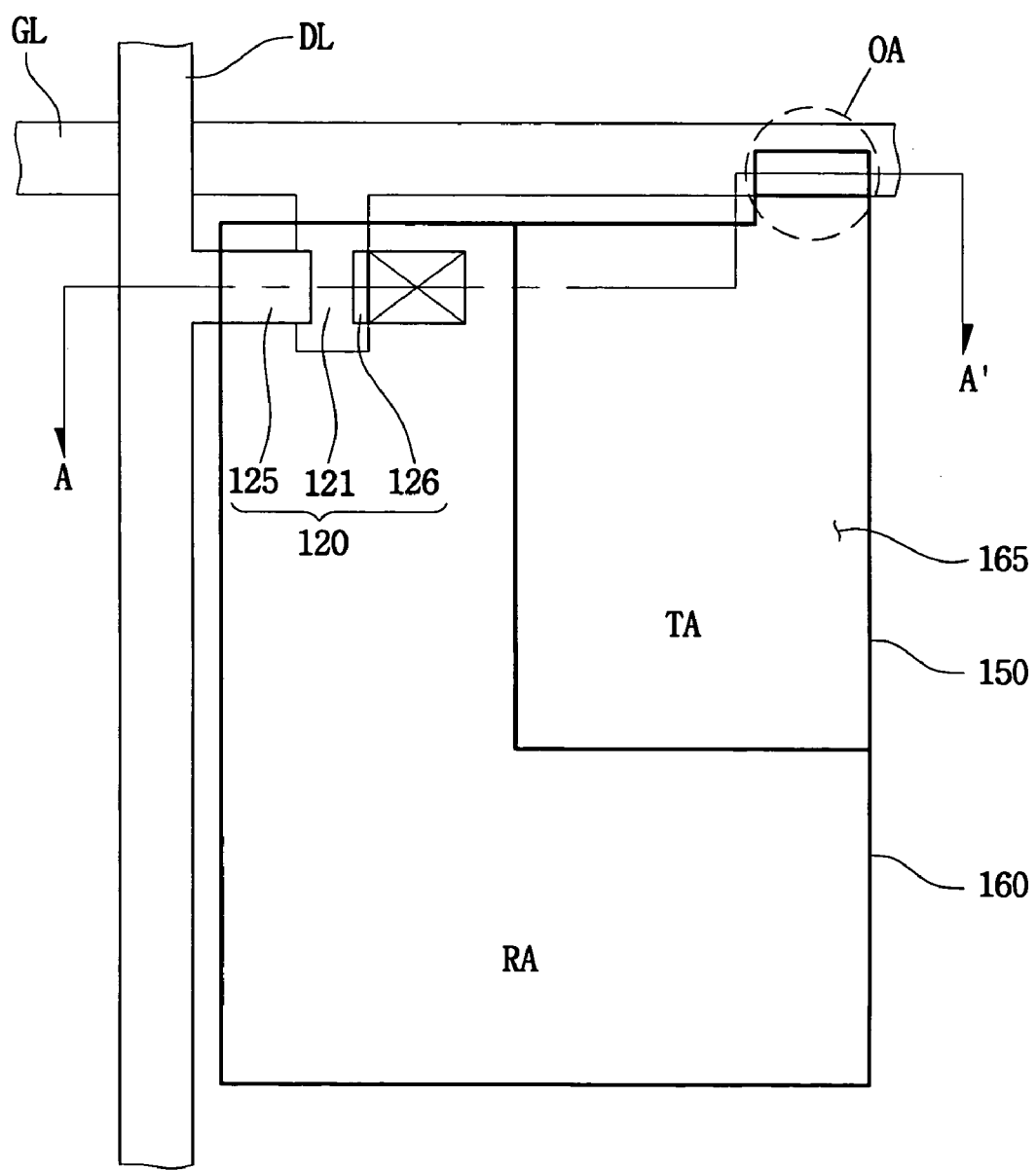
FIG. 2 is a plan view showing a pixel of the array substrate shown in FIG. 1.

FIG. 1 is a schematic plan view showing an array substrate according to an exemplary embodiment, and FIG. 2 is a plan view showing a pixel of the array substrate shown in FIG. 1. In this exemplary embodiment, the array substrate shown in FIGS. 1 and 2 may be applied to an LCD apparatus.

Referring to FIGS. 1 and 2, an array substrate 100 includes a gate line GL extended in a first direction D1 and a data line DL extended in a second direction D2 that is substantially perpendicular to the first direction D1.

A pixel area PA is defined in a matrix form on the array substrate 100 when the gate line GL and the data line DL cross each other. A thin film transistor (referred as TFT) 120 and a pixel electrode are disposed in the pixel area PA. The TFT 120 includes a gate electrode 121 electrically connected to the gate line GL, a source electrode 125 electrically connected to the date line DL, and a drain electrode 126 electrically connected to the pixel electrode. In this exemplary embodiment, the array substrate 100, generally, includes a plurality of gate lines and a plurality of data lines as described above, and thus the array substrate 100 may be divided into a plurality of pixel areas, and the TFT 120 and the pixel electrode are disposed in each of the pixel areas.

The pixel electrode includes a transmissive electrode 150 and a reflective electrode 160. The transmissive electrode 150 is electrically connected with the drain electrode 126 of the TFT 120, and the reflective electrode 160 disposed on the transmissive electrode 150 and electrically connected with the drain electrode 126 of the TFT 120 by the transmissive electrode 150. The reflective electrode 160 includes a transmissive window 165 so as to partially expose the transmissive electrode 150. Therefore, each pixel area PA is divided into a reflective area RA on which the reflective electrode 160 is formed, and a transmissive area TA on which the transmissive window 165 is formed.

Referring to FIG. 2, the transmissive area TA is positioned at a corner of the pixel area PA, and the transmissive electrode 150 is partially extended toward to the gate line GL, so that the transmissive electrode 150 is partially overlapped with the gate line GL. However, the pixel area PA may have various structures in case that the transmissive area TA is partially adjacent to the gate line GL.

The transmissive electrode 150 is overlapped while being insulated from the gate line GL in the transmissive area TA. The transmissive electrode 150 may be electrically connected to the gate line GL.

Figure 3A:
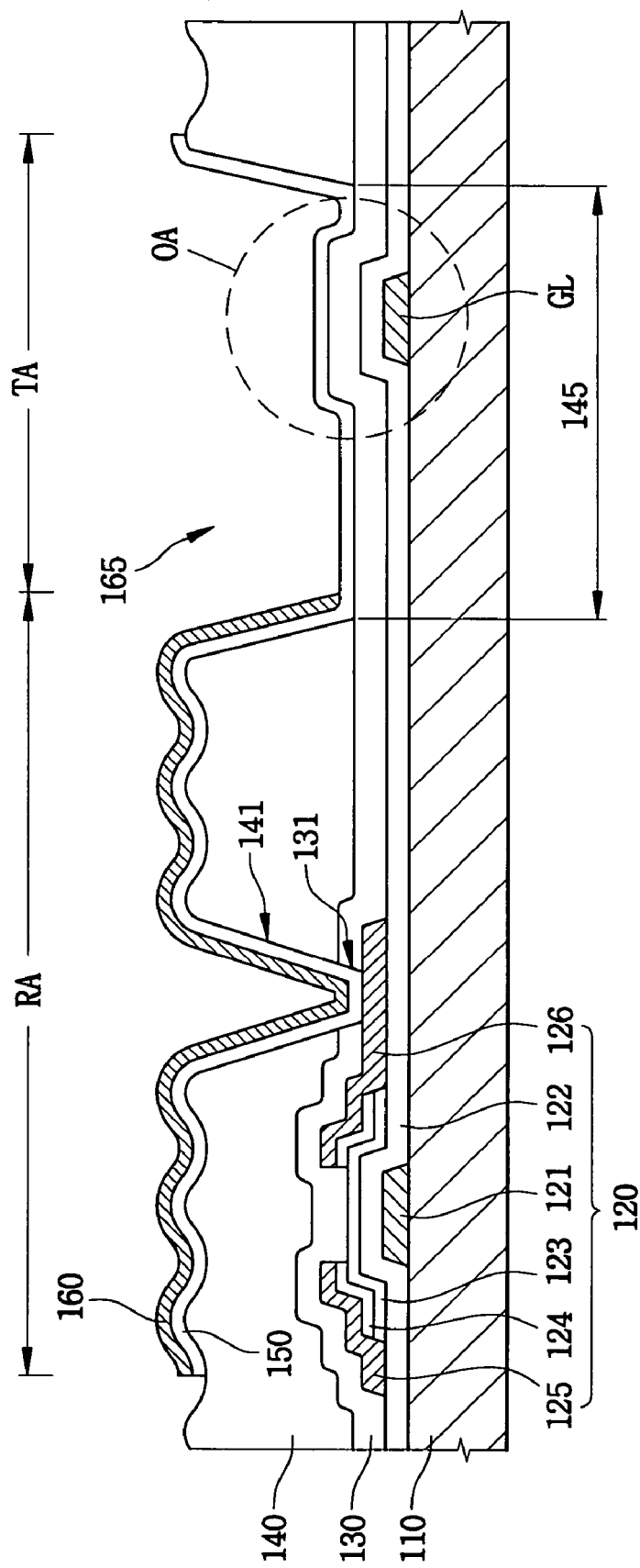
FIG. 3A is a cross-sectional view taken along the line A–A' of FIG. 2.
Figure 3B:
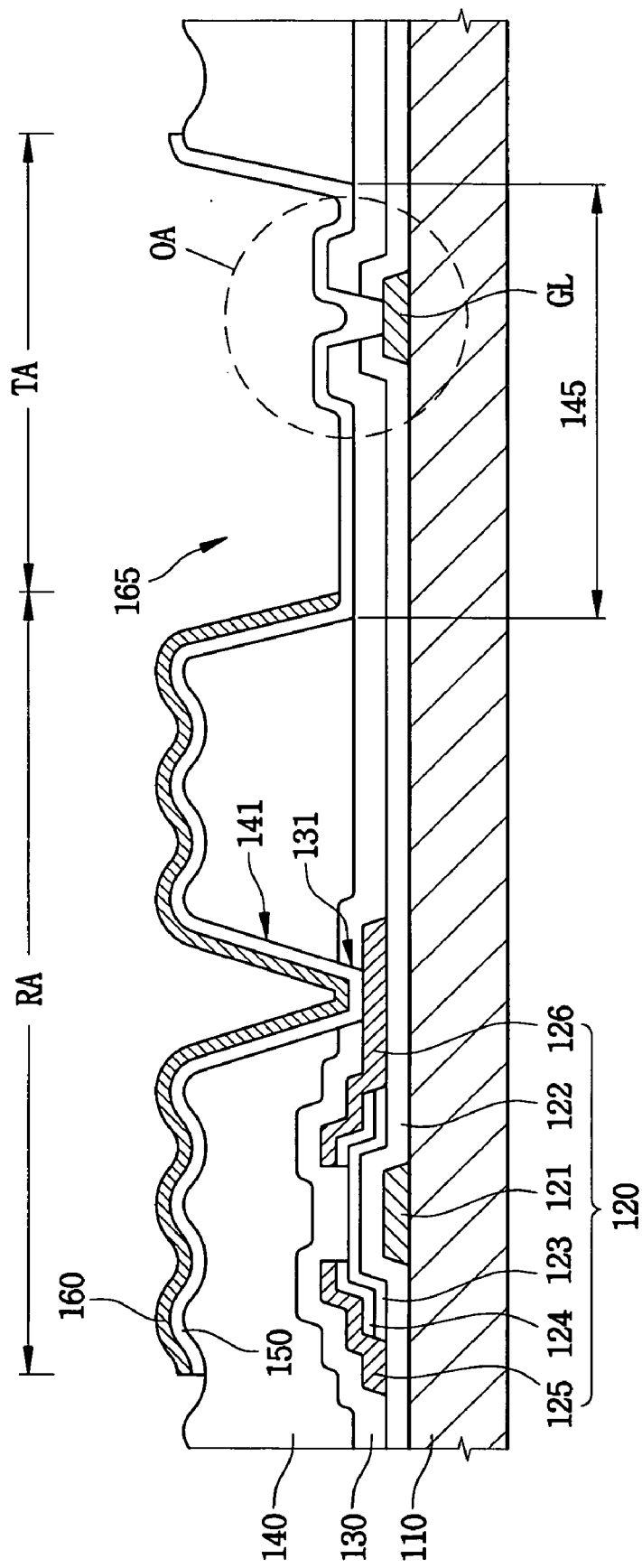
FIG. 3B is a cross-sectional view showing a gate line electrically connected with a transparent electrode.

FIG. 3A is a cross-sectional view taken along the A–A' line of FIG. 2, and FIG. 3B is a cross-sectional view showing a gate line electrically connected to a transparent electrode.

Referring to FIGS. 2 and 3A, the gate line GL and the gate electrode 121 branched from the gate line GL are formed on a first substrate 110. A gate insulating layer 122 comprising silicon nitride (SiNx) is deposited on the gate electrode 121 and the gate line GL in a thickness of about 4000□. An active layer 123 and an ohmic contact layer 124 are successively deposited on the gate insulating layer 122. The data line DL, the source electrode 125 branched from the data line DL and the drain electrode 126 separated from the source electrode 125 are formed on the first substrate 110, thereby completing the TFT 120 on the first substrate 110.

An inorganic insulating layer 120 including silicon nitride (SiNx) is deposited in a thickness of about 2000□ on the TFT 120 so as to protect the TFT 120. A first contact hole 131 is formed in the inorganic insulating layer 130 to partially expose the drain electrode 126 of the TFT 120. Then, an organic insulating layer 140 including acrylic resin is deposited in a thickness of about 2 to about 3 μm on the inorganic insulating layer 130. A second contact hole 141 corresponding to the first contact hole 131 is formed in the organic insulating layer 140 so as to expose the drain electrode 126 of the TFT 120.

The organic insulating layer 140 includes an opening 145 formed at a position corresponding to the transmissive area TA in order to expose the inorganic insulating layer 130. The inorganic insulating layer 130 that covers the gate line GL is exposed through the opening 145. The organic insulating layer 140 includes protrusions and recesses in the reflective area RA so as to enhance a reflection efficiency of light and a viewing angle.

The transmissive electrode 150 including a transparent conductive material, for example, such as indium tin oxide (ITO) or indium zinc oxide (IZO) and so on, is uniformly formed on the inorganic insulating layer 130 which is exposed through the organic insulating layer 140 and the opening 145. The transmissive electrode 150 is electrically connected to the drain electrode 126 of the TFT through the first and second contact holes 131 and 141. Also, an overlapped area OA in which the transmissive electrode 150 is overlapped with the gate line GL is provided at the transmissive area TA. The inorganic insulating layer 130 and the gate insulating layer 122 are disposed between the transmissive electrode 150 and the gate line GL at the transmissive area TA.

The reflective electrode 160 including a single-layer of aluminum neodymium (AlNd) or a double-layer of aluminum neodymium (AlNd) and molybdenum tungsten (MoW) is uniformly deposited in terms of a thickness on the transmissive electrode 150. The reflective electrode 160 includes the transmissive window 165 through which the transmissive electrode 150 is exposed. The reflective electrode 160 also includes protrusions and recesses by the fact that the organic insulating layer 140 includes protrusions and recesses. Therefore, the reflective electrode 160 may improve the reflection efficiency and the viewing angle of the light.

A defective pixel such as the high pixel may be caused by an internal deficiency or an external factor of the array substrate 100.

To prevent the high pixel, the transmissive electrode 150 may be electrically connected with the gate line GL in the overlapped area OA as shown in FIG. 3B. That is, when a laser is irradiated onto the overlapped area OA of the transmissive electrode 150 and the gate line GL, the inorganic insulating layer 130 and the gate insulating layer 122 are melted, so that the transmissive electrode 150 is electrically connected with the gate line GL. Thus, since the pixel in which the high pixel occurs may be maintained in an inactive state, thereby preventing deterioration of the display quality.

Since the transmissive electrode 150 is electrically connected with the reflective electrode 160, when the transmissive electrode 150 is electrically connected with the gate line GL, the reflective electrode 160 is therefore electrically connected to the gate line GL.

The gate line GL outputs an on-voltage that is sufficient for driving the TFT 120 connected to gate line GL for a predetermined period in a frame, and then outputs an off-voltage during a remaining period of the frame.

When the transmissive electrode 150 and the gate line GL are electrically connected to each other, the transmissive electrode 150 may maintain the off-voltage during the remaining period. Thus, the LCD apparatus may prevent an operation of the defective pixel caused by the high pixel, thereby improving a display quality of the LCD apparatus.

Figure 4:
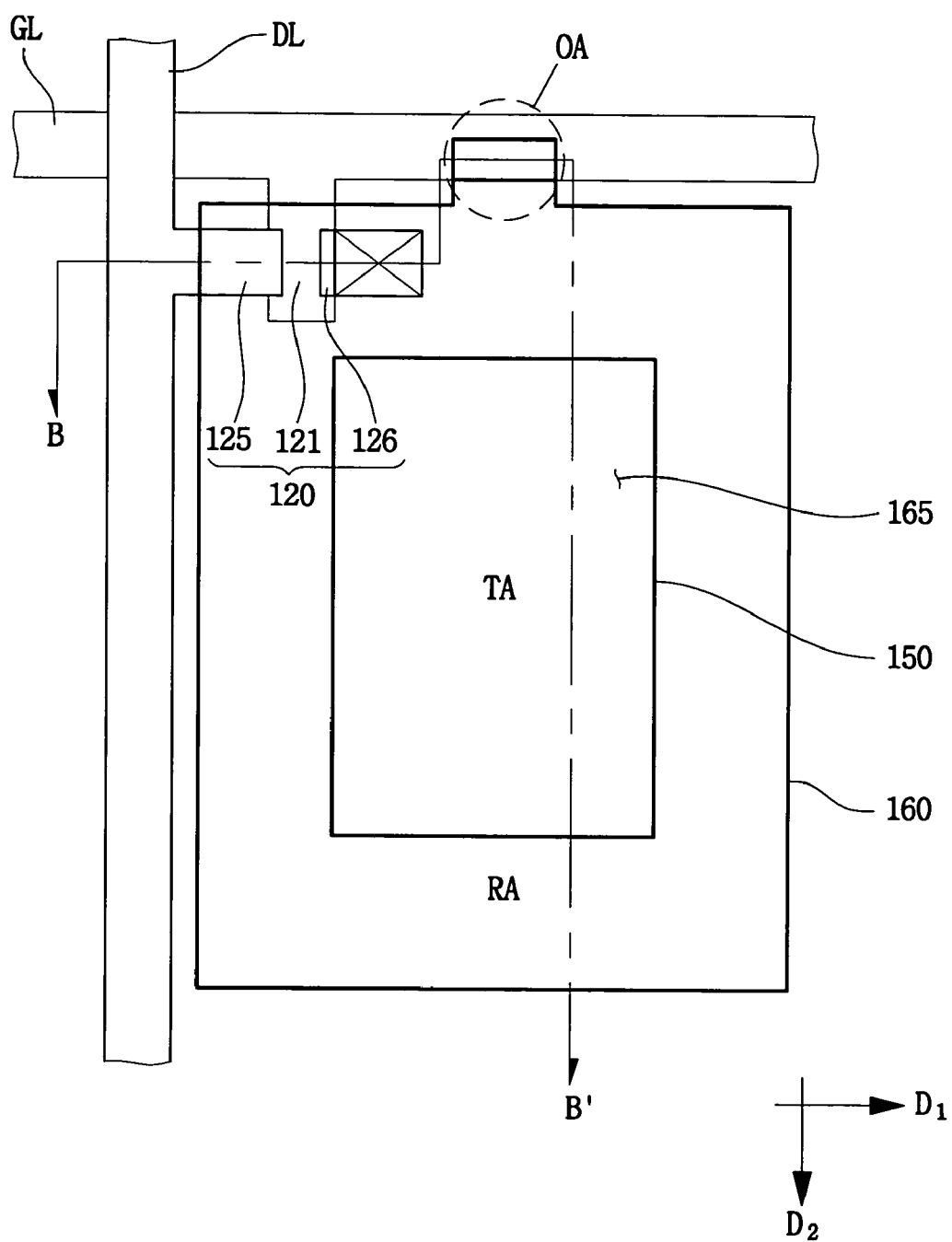
FIG. 4 is a plan view showing a pixel of an array substrate according to another exemplary embodiment of the present invention.
Figure 5A:
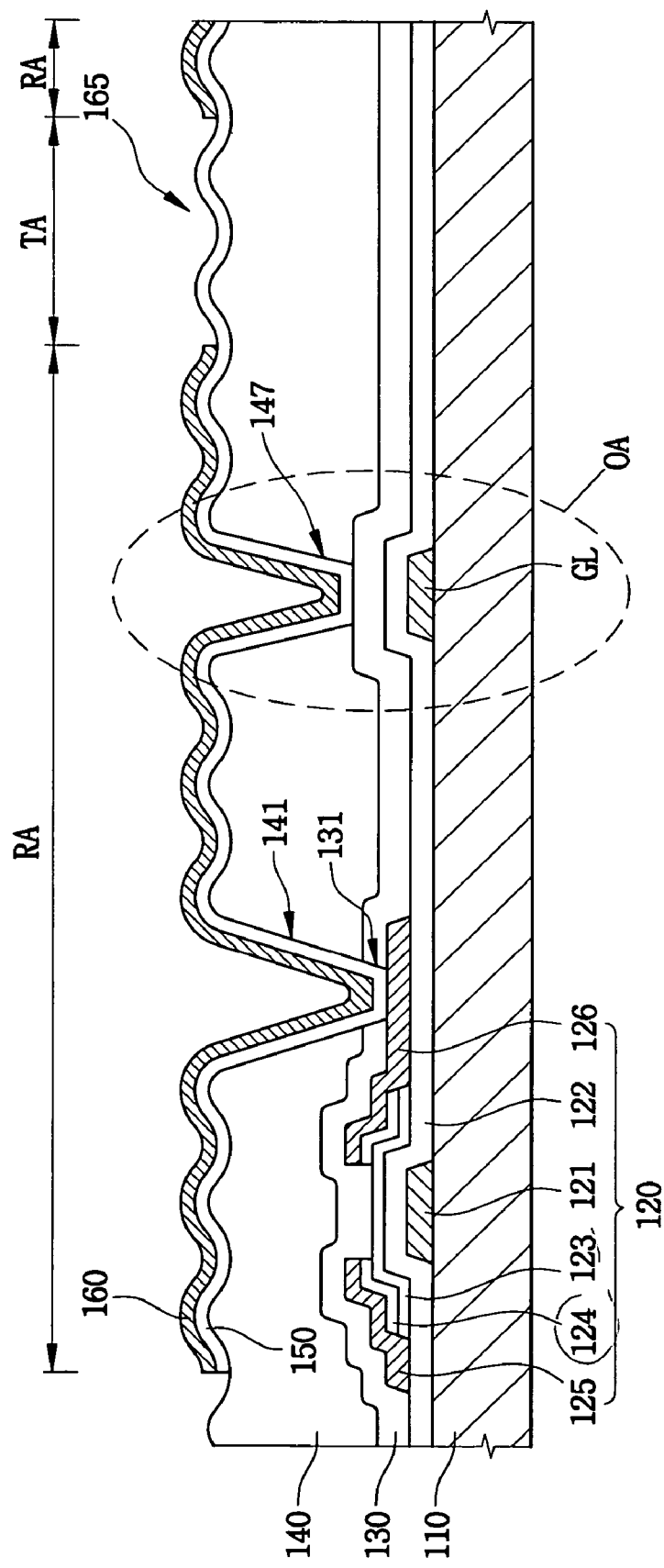
FIG. 5A is a cross-sectional view showing a pixel taken along the line B–B' of FIG. 4.

FIG. 4 is a plan view showing a pixel of an array substrate according to another exemplary embodiment of the present invention, and FIG. 5A is a cross-sectional view taken along the line B–B' of FIG. 4.

Referring to FIGS. 4 and 5A, an array substrate includes a gate line GL extended in a first direction D1, a data line DL extended in a second direction D2 substantially perpendicular to the first direction D1, and a pixel area defined by the gate line GL and the data line DL.

A TFT 120, a transmissive electrode 150 and a reflective electrode 160 are disposed in the pixel area. The TFT 120 includes a gate electrode 121 electrically connected to the gate line GL, a source electrode 125 electrically connected to the data line DL, and a drain electrode 126 electrically connected to the transmissive electrode 150 and to reflective electrode 160, respectively. The transmissive electrode 150 is directly and electrically connected to the drain electrode 126. The reflective electrode 160 is disposed on the transmissive electrode 150, and electrically connected to the drain electrode 126 of the TFT 120 through the transmissive electrode 150. The reflective electrode 160 includes a transmissive window 165 that is partially opened so as to partially expose the transmissive electrode 150. Thus, the pixel area is divided into a reflective area RA on which the reflective electrode 160 is formed and a transmissive area TA through which the transmissive window 165 is formed.

An overlapped area OA that the reflective electrode 160 is overlapped with the gate line GL is provided in the reflective area RA while the reflective electrode 160 is insulated from the gate line GL.

As shown in FIGS. 4 and 5A, the gate line GL and the gate electrode 121 diverged from the gate line GL are disposed on a first substrate 110. A gate insulating layer 122 is formed over the gate electrode 121 and the gate line GL. An active layer 123 and an ohmic contact layer 124 are successively formed on the gate insulating layer 122. The data line DL, the source electrode 125 diverged from the data line DL, and the drain electrode 126 separated from the source electrode 125 are formed on the first substrate 110, thereby completing the TFT 120 on the first substrate 110.

An inorganic insulating layer 130 is formed on the TFT 120 so as to protect the TFT 120. The inorganic insulating layer 130 includes a first contact hole 131 through which the drain electrode 126 of the TFT 120 is exposed. Subsequently, an organic insulating layer 140 of acrylic resin is formed on the inorganic insulating layer 140. The organic insulating layer 140 includes a second contact hole 141 formed at a position corresponding to the first contact hole 131 so as to expose the drain electrode 126 of the TFT 120.

Additionally, the organic insulating layer 140 further includes an opening 147, through which the inorganic insulating layer 130 is exposed, formed in the overlapped area OA.

The transmissive electrode 150 is formed on the organic insulating layer 140 and the inorganic insulating layer 130 exposed through the opening 147. The transmissive electrode 150 is electrically connected with the drain electrode 126 of the TFT 120 through the first and second contact holes 131 and 141.

The reflective electrode 160 having the transmissive window 165 is formed on the transmissive electrode 150. The reflective electrode 160 is overlapped with the gate line GL in the overlapped area OA. The reflective electrode 160 and the gate line GL have the inorganic insulating layer 130 and the gate insulating layer 122 disposed therebetween.

Figure 5B:
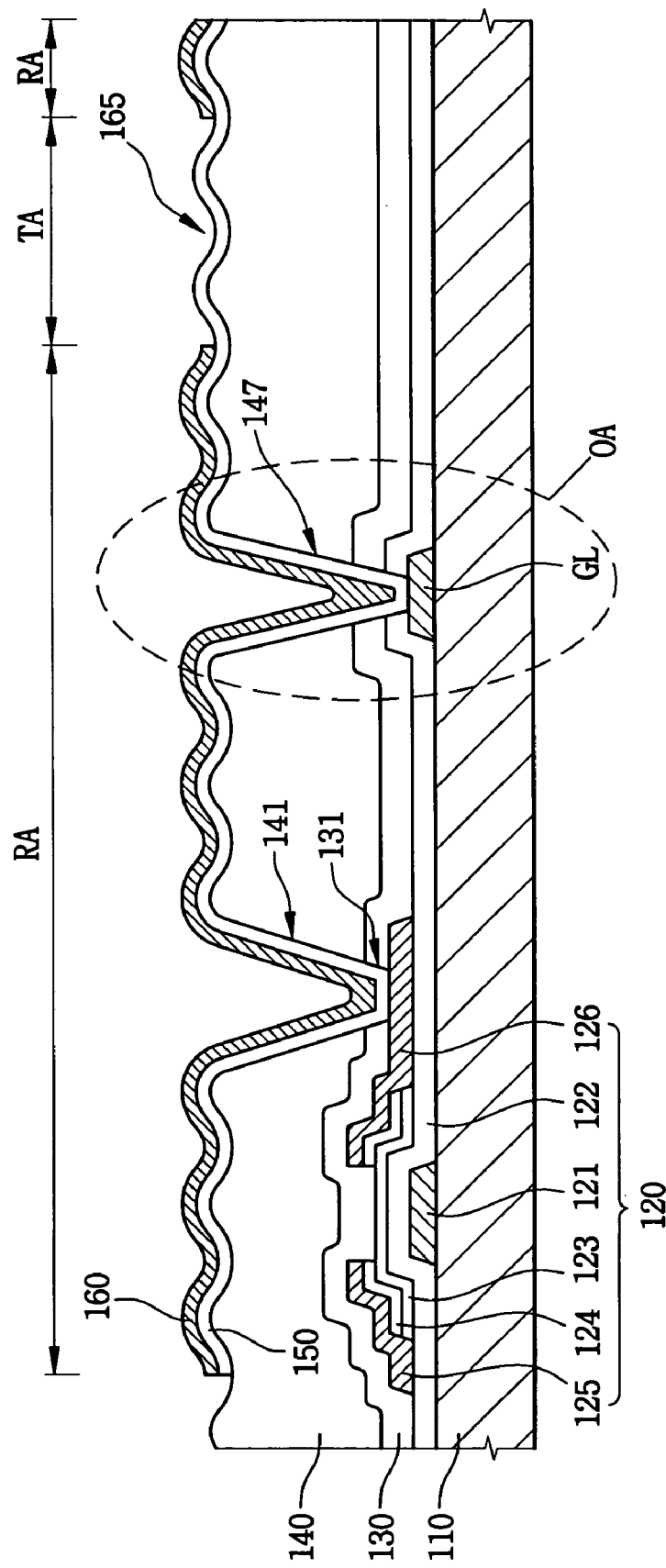
FIG. 5B is a cross-sectional view showing a gate line electrically connected with a reflective electrode.

FIG. 5B is a cross-sectional view showing the gate line electrically connected with the reflective electrode.

Referring to FIG. 5B, a defective pixel includes a structure that electrically connects the reflective electrode 160 and the gate line GL in the overlapped area OA.

In case that the high pixel is caused by an internal deficiency or an external factor of the array substrate, a laser is irradiated onto the overlapped area OA so as to electrically connect the reflective electrode 160 to the gate line GL.

When the transmissive electrode 150 and the reflective electrode 160 are electrically connected to the gate line GL, the transmissive electrode 150 and the reflective electrode 160 may maintain the off-voltage. As a result, the defective pixel is kept as in an inactive state. Thus, the LCD apparatus may prevent an operation of the defective pixel, thereby improving a display quality of the LCD apparatus.

In FIGS. 1 to 5B, a reflective-transmissive type LCD apparatus that includes the transmissive area TA and the reflective area RA in a pixel area PA has been described. However, the structure of the pixel area PA according to the present invention may be applied to a reflective-transmissive type LCD apparatus that includes a pixel area having only a reflective area and an organic insulating layer disposed under the reflective electrode 160.

Figure 6:
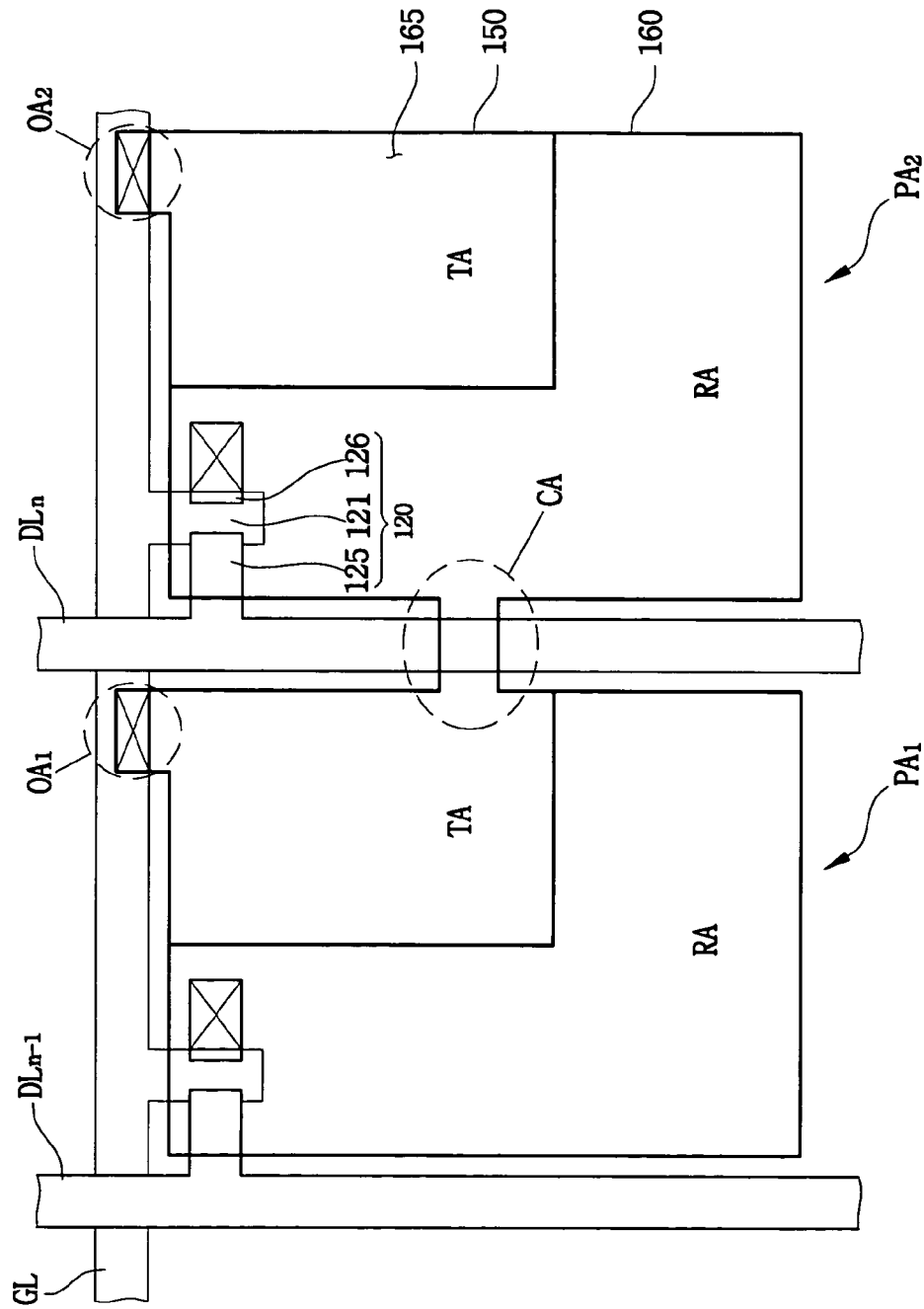
FIG. 6 is a plan view showing a pixel of an array substrate according to another exemplary embodiment of the present invention.

FIG. 6 is a plan view showing an array substrate according to another exemplary embodiment of the present invention.

Referring to FIG. 6, an array substrate according to another exemplary embodiment of the present invention includes a gate line GL, a first data line DLn–1 and a second data line DLn that are insulated from and crossing with the gate line GL. The first data line DLn–1 is an n–$1^{st}$ data line, and the second data line DLn is an $n^{th}$ data line. In this exemplary embodiment, the n is a natural number greater than or equal to 2.

The array substrate includes a first pixel area PA1 defined by the gate line GL and the first data line DLn–1, and a second pixel area PA2 defined by the gate line GL and the second data line DLn. A TFT 120, a transmissive electrode 150 and a reflective electrode 160 are formed in each of the first and second pixel areas PA1 and PA2. In this exemplary embodiment, the first pixel area PA1 has a same structure as that of the second pixel area PA2, and thus same numerals are applied to the same structures of the first and second pixel areas PA1 and PA2.

One of the transmissive electrode 150 and the reflective electrode 160 is overlapped with the gate line GL. In FIG. 6, a structure of the transmissive electrode 150 overlapped with the gate line GL has been shown.

In a first overlapped area OA1 of the first pixel area PA1, the transmissive electrode 150 is overlapped with the gate line GL, and the transmissive electrode 150 is also overlapped with the gate line GL in a second overlapped area OA2 of the second pixel area PA2.

In a process for manufacturing the array substrate, the transmissive electrode 150 formed in each of the first and second pixel areas PA1 and PA2 may be electrically connected to each other, the reflective electrode 160 formed in each of the first and second pixel areas PA1 and PA2 may be electrically connected to each other, or the transmissive electrode 150 and the reflective electrode 160 of the first and second pixel areas PA1 and PA2 may be electrically connected to each other. In case that the transmissive electrode 150 and the reflective electrode 160 are electrically connected to each other in the first and second pixel areas PA1 and PA2, same voltage may be applied to the transmissive electrode 150 and the reflective electrode 160 formed in the first and second pixel areas PA1 and PA2. As a result, the first and second pixel areas PA1 and PA2 formed on the array substrate may not normally operate.

In case that the transmissive electrode 150 formed in the first pixel area PA1 is electrically connected with the gate line GL while the first and second pixel areas PA1 and PA2 do not normally operated, the off-voltage may be applied to the transmissive electrode 150 and the reflective electrode 160 formed in each of the first and second pixel areas PA1 and PA2.

That is, in a state when the transmissive electrode 150 or the reflective electrode 160 formed in each of the first and second pixel areas PA1 and PA2 are abnormally and electrically connected to each other, the off-voltage may be applied to the transmissive electrode 150 formed in the second pixel area PA2 by electrically connecting the transmissive electrode 150 formed in the first pixel area PA1 to the gate line GL.

Therefore, two defective pixels in the first and second pixel areas PA1 and PA2 may not further receive the voltage, thereby preventing the defective pixels from further operating abnormally and enhancing a display quality.

Figure 7:
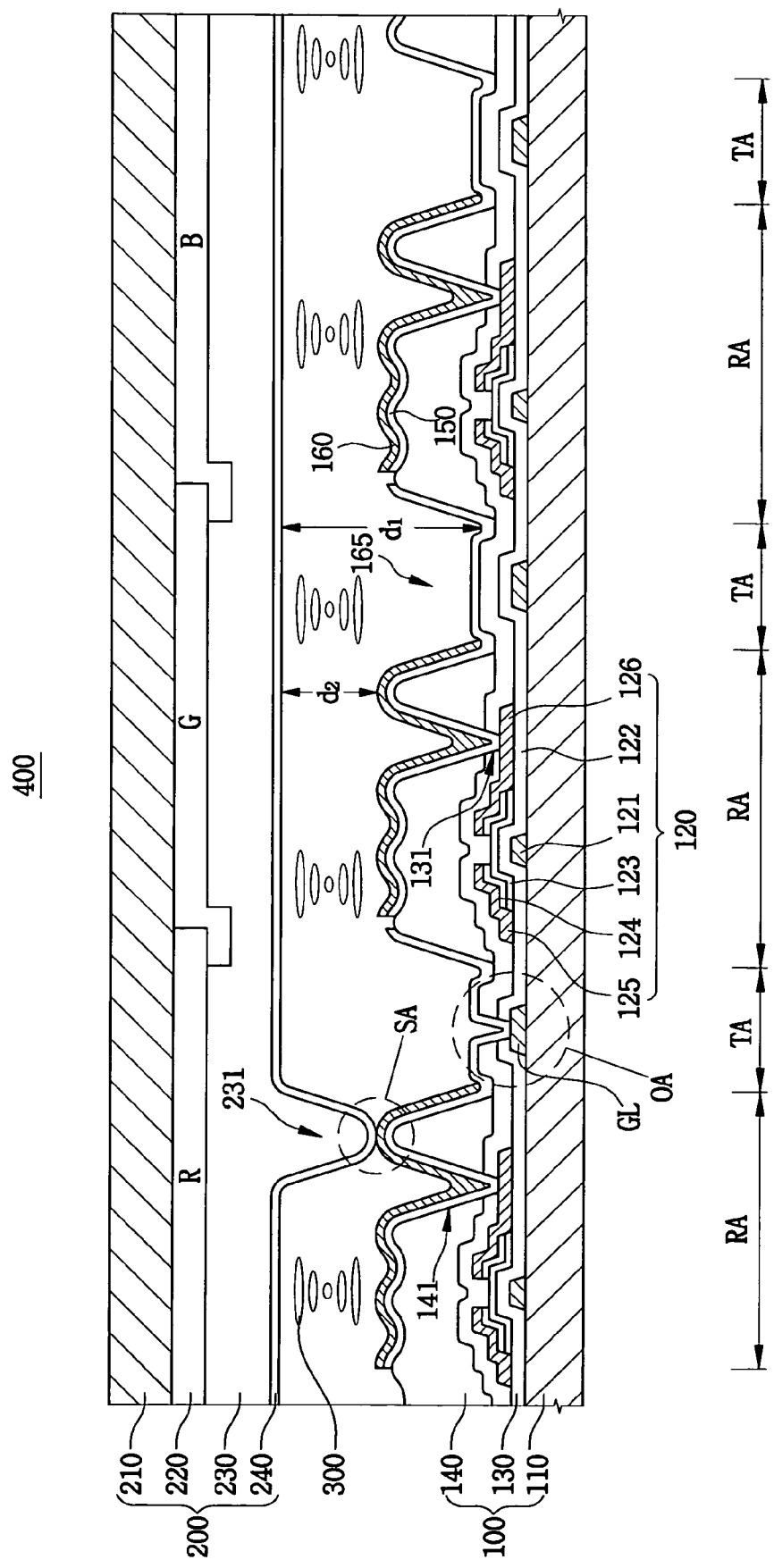
FIG. 7 is a cross-sectional view showing an LCD apparatus according to another exemplary embodiment of the present invention.

FIG. 7 is a cross-sectional view showing an LCD apparatus according to another exemplary embodiment of the present invention.

Referring to FIG. 7, an array substrate according to another exemplary embodiment of the present invention includes an array substrate 100, a color filter substrate 200 facing the array substrate 100, and a liquid crystal layer 300 interposed between the array substrate 100 and the color filter substrate 200.

The array substrate 100 includes a TFT 120, a transmissive electrode 150 and a reflective electrode 160 formed in a pixel area defined by a gate line GL and a data line DL,. The transmissive electrode 150 is electrically connected with a drain electrode 126 of the TFT 120, and the reflective electrode 160 formed on the transmissive electrode 150 is electrically connected with the drain electrode 126 of the TFT 120 through the transmissive electrode 150.

The reflective electrode 160 includes a transmissive window 165 through which the transmissive electrode 150 is partially exposed. Thus, the pixel area is divided into a reflective area RA on which the reflective electrode 160 is formed and a transmissive area TA on which the transmissive window 165 is formed.

The transmissive electrode 150 is overlapped with the gate line GL while insulated from the gate line GL in the transmissive area TA. The transmissive electrode 150, however, may be electrically connected with the gate line GL.

The color filter substrate 200 includes a color filter 220, a planarization layer 230 and a common electrode 240 successively formed on a second substrate 210.

The color filter 220 includes a red color pixel (R), a green color pixel (G) and a blue color pixel (B). Each of the R.G.B color pixels is partially overlapped with an adjacent color pixel thereof.

The planarization layer 230 is formed on the color filter 220 so as to reduce a step-difference due to the R.G.B color pixels overlapped with each other. The planarization layer 230 comprises an organic layer, for example, such as an acrylic resin of a photosensitive organic insulating layers or polyimide. The common electrode 240 is uniformly formed in a thickness on the planarization layer 230. The common electrode 240 includes a transparent conductive layer, for example, such as ITO, IZO and so on.

As shown in FIG. 7, a protrusion 231 may be formed due to fine dusts generated by a process in which the planarization layer is formed so as to reduce the step-difference of the color filter 220 or aggregation of an organic material for the planarization layer 230. Although the protrusion 231 is formed, the common electrode 240 is uniformly formed on the planarization layer 230 on which the protrusion 231 is formed.

In general, a first distance d1 between the transmissive electrode 150 and the common electrode 240 in the transmissive area TA is greater than a second distance d2 between the reflective electrode 160 and the common electrode 240 in the reflective area RA. In other words, the LCD apparatus 400 includes a first cell gap at the transmissive area TA and a second cell gap at the reflective area RA. The first and second cell gaps are different from each other.

In comparison, the second cell gap in the reflective area RA is relatively smaller than the first cell gap in the transmissive area TA, so that the common electrode 240 formed on the protrusion 231 may be shorted with the reflective electrode 160 formed on the transmissive electrode 150 in the reflective area RA.

When the common electrode 240 is electrically connected with the reflective electrode 160, the transmissive electrode 150 and the reflective electrode 160 may receive a voltage lower or higher than a voltage normally applied thereto. Consequently, a pixel corresponding to the shorted area SA brightly or darkly appears on a screen of the LCD apparatus 400.

A laser is irradiated onto an overlapped area OA of the transmissive electrode 150 and the gate line GL so as to electrically connect the transmissive electrode 150 with the gate line GL. An off-voltage is provided to the transmissive electrode 150 and the reflective 160 through the gate line GL. The pixel corresponding to the shorted area SA may be shown mostly as dark on the screen of the LCD apparatus 400, thereby enhancing a display quality of the LCD apparatus 400.

In FIG. 7, the R.G.B color pixels of the color filter 220 partially overlapped with each other has been shown. However, although not shown in FIG. 7, the color filter 220 may have the R, G and B color pixels spaced apart from each other by a predetermined distance and a light blocking layer (not shown) disposed between the R, G and B color pixels.

According to the array substrate and the LCD apparatus having the array substrate, the gate line GL formed on the array substrate is overlapped with a pixel electrode. The inorganic insulating layer is disposed between the gate line GL and the pixel electrode. The gate line GL is electrically connected with the pixel electrode so as to discharge a signal applied to the pixel electrode. The organic insulating layer disposed between the pixel electrode and the gate line GL includes an opening through which the inorganic insulating layer is exposed.

Therefore, since the organic insulating layer includes the opening formed in the overlapped area of the gate line GL and the pixel electrode, the pixel electrode of malfunctioning may be electrically connected with the gate line GL.

As a voltage applied to the malfunctioning pixel electrode is discharged through the gate line GL, the LCD apparatus may prevent an occurrence of high pixel, thereby improving a display quality of the LCD apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An array substrate comprising:
   a substrate;
   a gate signal line formed on the substrate;
   a first insulating layer, formed on the substrate and the gate signal line, comprising a first hole formed on the gate signal line;
   a second insulating layer, formed on the first insulating layer, comprising an opening which exposes a part of the first insulating layer; and
   a plurality of pixel electrodes formed on the first insulating layer and the second insulating layer,
   wherein at least one of the pixel electrodes is electrically connected to the gate signal line through the first hole.

2. The array substrate of claim 1, wherein the pixel electrode comprises:
   a transmissive electrode; and
   a reflective electrode that is formed on the transmissive electrode, and has a transmissive window to expose the transmissive electrode.

3. The array substrate of claim 2, wherein the second insulating layer comprises a thickness in a reflective area on which the reflective electrode is formed thicker than a thickness in a transmissive area at which the transmissive window is formed.

4. The array substrate of claim 3, wherein the gate signal line is formed on the transmissive area, and overlapped with the transmissive electrode.

5. The array substrate of claim 3, wherein the gate signal line is formed on the reflective area, and overlapped with the reflective electrode.

6. The array substrate of claim 3, wherein the second insulating layer comprises a plurality of convex and concave portions formed in the reflective area.

7. The array substrate of claim 6, wherein the pixel electrodes have a plurality of convex and concave portions corresponding to the plurality of convex and concave portions of the second insulating layer.

8. The array substrate of claim 1, further comprising:
   a gate line;
   a data line substantially perpendicular to the gate line; and
   a thin film transistor having a gate electrode connected to the gate line, a source electrode connected to the data line, and a drain electrode connected to the pixel electrode.

9. The array substrate of claim 8, wherein the gate signal line is connected to the gate line.

10. The array substrate of claim 1, further compring:
    a third insulating layer, formed between the first insulating layer and the second insulating layer, including a second hole aligned with the first hole.

11. The array substrate of claim 1, wherein the pixel electrode is a reflective electrode or a transmissive electrode.

12. A liquid crystal display apparatus comprising:
    a first substrate including:
      a gate signal line;
      a first insulating layer, formed on the first substrate and the gate signal line, comprising a first hole formed on the gate signal line;
      a second insulating layer, formed on the first insulating layer, comprising an opening which exposes a part of the first insulating layer; and
      a plurality of pixel electrodes formed on the first insulating layer and the second insulating layer;
    a second substrate that includes a common electrode comprising a protrusion facing the pixel electrodes on the first insulating layer; and
    a liquid crystal layer interposed between the first substrate and the second substrate,
    wherein at least one of the pixel electrodes is electrically connected to the gate signal line through the first hole.

13. The LCD apparatus of claim 12, wherein the pixel electrode comprises:
    a transmissive electrode; and
    a reflective electrode disposed on the transmissive electrode, the reflective electrode having a transmissive window so as to expose the transmissive electrode.

14. The LCD apparatus of claim 13, wherein the second insulating layer comprises a first thickness in a reflective area on which the reflective electrode is formed and a second thickness in a transmissive area at which the transmissive window is formed, and the first thickness is thicker than the second thickness.

15. The LCD apparatus of claim 14, wherein a first distance between the transmissive electrode and the common electrode is larger than a second distance between the reflective electrode and the common electrode.

16. The liquid crystal display apparatus of claim 12, wherein the first substrate further comprises a third insulating layer, formed between the first insulating layer and the second insulating layer, including a second hole aligned with the first hole.

17. An array substrate comprising:
    a substrate;
    a gate signal line formed on the substrate;
    a first insulating layer, formed on the gate signal lines, comprising a first hole formed on the gate signal line;
    a second insulating layer, formed on the first insulating layer, comprising an opening which exposes a part of the first insulating layer; and
    a plurality of pixel electrodes formed on the first insulating layer and the second insulating layer,
    wherein the pixel electrodes comprise a plurality of convex and concave portions, and at least one of the pixel electrodes is electrically connected to the gate signal line through the first hole.

18. The array substrate of claim 17, wherein the pixel electrode comprises:
    a transmissive electrode; and
    a reflective electrode disposed on the transmissive electrode, and having a transmissive window to expose the transmissive electrode.

19. The array substrate of claim 18, wherein the gate signal line is formed in a transmissive area having the transmissive window, and overlapped with the transmissive electrode.

20. The array substrate of claim 17, wherein the pixel electrode is a reflective electrode or a transmissive electrode.

21. The array substrate of claim 17, further comprising a third insulating layer, formed between the first insulating layer and the second insulating layer, including a second hole aligned with the first hole.

22. The array substrate of claim 17, wherein the first and second insulating layers have a plurality of convex and concave portions corresponding to the plurality of convex and concave portions of the pixel electrodes.

* * * * *